US010238001B2

United States Patent
Agrawal et al.

(10) Patent No.: US 10,238,001 B2
(45) Date of Patent: Mar. 19, 2019

(54) CONFIGURABLE DATA CENTER PLATFORM

(71) Applicant: CIMCON Lighting, Inc., Billerica, MA (US)

(72) Inventors: Anil Agrawal, Westford, MA (US); William Anthony White, III, Carlisle, MA (US)

(73) Assignee: CIMCON Lighting, Inc., Billerica, MA (US)

( * ) Notice: Subject to any disclaimer, the term of this patent is extended or adjusted under 35 U.S.C. 154(b) by 0 days.

(21) Appl. No.: 15/863,747

(22) Filed: Jan. 5, 2018

(65) Prior Publication Data

US 2018/0213671 A1 Jul. 26, 2018

Related U.S. Application Data

(63) Continuation-in-part of application No. 15/446,861, filed on Mar. 1, 2017, now Pat. No. 10,094,546.
(Continued)

(51) Int. Cl.
*H05K 7/14* (2006.01)
*H05K 7/20* (2006.01)
(Continued)

(52) U.S. Cl.
CPC ......... *H05K 7/1497* (2013.01); *E04F 10/005* (2013.01); *E04H 5/00* (2013.01);
(Continued)

(58) Field of Classification Search
CPC .................. G01D 11/24; F21W 2131/103
See application file for complete search history.

(56) References Cited

U.S. PATENT DOCUMENTS 4,731,551 A 3/1988 Gibbs et al.
6,462,775 B1 * 10/2002 Loyd .................. F21V 33/0052
348/143
(Continued)

FOREIGN PATENT DOCUMENTS

KR 10-2010-0009556 1/2010
WO 2013/026008 2/2013

OTHER PUBLICATIONS

International Search Report and Written Opinion from PCT application PCT/US2017/020238 dated Aug. 24, 2017. (7 pages).
(Continued)

*Primary Examiner* — Fritz M Fleming
(74) *Attorney, Agent, or Firm* — Fish & Richardson P.C.

(57) ABSTRACT

A configurable data center platform includes an enclosure configured to affix to a support structure, the enclosure configured for housing one or more processing systems that form a data center, one or more transceivers configured to enable the one or more processing systems to communicate with one or more remote devices, one or more sensors; and an electrical power distribution subsystem configured to condition a received electrical current to one or more conditioned electrical currents that power the one or more processing systems and the one or more sensors, wherein the enclosure comprises a cooling system that removes heat from the one or more processing systems and the one or more sensors.

28 Claims, 10 Drawing Sheets

Related U.S. Application Data

(60) Provisional application No. 62/338,769, filed on May 19, 2016.

(51) Int. Cl.
 *E04H 5/00* (2006.01)
 *E04F 10/00* (2006.01)

(52) U.S. Cl.
 CPC ....... *H05K 7/1498* (2013.01); *H05K 7/20127* (2013.01); *H05K 7/20836* (2013.01); *E04H 2005/005* (2013.01)

(56) References Cited

U.S. PATENT DOCUMENTS

| | | |
|---|---|---|
| 7,723,862 B1 | 5/2010 | Spillman et al. |
| 7,828,463 B1 | 11/2010 | Willis |
| 8,382,387 B1 * | 2/2013 | Sandoval ............ F21V 33/0052 348/143 |
| 9,226,368 B2 | 12/2015 | Agrawal |
| 9,387,928 B1 | 7/2016 | Gentry et al. |
| 9,651,420 B2 | 5/2017 | Weber |
| 2007/0013513 A1 | 1/2007 | Tang et al. |
| 2008/0175216 A1 | 7/2008 | Nasco |
| 2009/0222223 A1 * | 9/2009 | Walters ................. G01R 31/44 702/58 |
| 2011/0062888 A1 | 3/2011 | Bondy et al. |
| 2012/0074641 A1 | 3/2012 | Murata |
| 2013/0015707 A1 | 1/2013 | Redmann |
| 2013/0040471 A1 | 2/2013 | Gervais et al. |
| 2013/0044488 A1 * | 2/2013 | Hreish ................... F21V 33/00 362/253 |
| 2013/0064136 A1 | 3/2013 | Apostolakis |
| 2013/0181636 A1 | 7/2013 | Agrawal |
| 2015/0124100 A1 | 5/2015 | McRory |
| 2015/0173159 A1 | 6/2015 | Lin et al. |

OTHER PUBLICATIONS

Sensity NetSense Core Node EX, Externally mounted NEMA Connector, www.sensity.com, no date provided on document.

* cited by examiner

CONFIGURABLE DATA CENTER PLATFORM

CLAIM OF PRIORITY

This application claims priority as a Continuation in Part to U.S. patent application Ser. No. 15/446,861, filed on Mar. 1, 2017, the entire contents of which are hereby incorporated by reference and which claims priority under 35 U.S.C. § 119(e) to U.S. Patent Application Ser. No. 62/338,769, filed on May 19, 2016, the entire contents of which are also hereby incorporated by reference.

TECHNICAL FIELD

This disclosure generally relates to a configurable data center facility configured to integrate with existing civil infrastructure.

BACKGROUND

Some essential missions of data center facilities are to provide quality power distribution, internal environmental control, external communications, physical security, shelter, and monitoring & reporting of key metrics. A data center facility includes its own power, computation, and communications capability, separate from that of the IT workload equipment installed at the facility.

SUMMARY

This document describes a configurable data center platform that includes an enclosure configured to affix to a support structure, the enclosure configured for housing: one or more processing systems that form a data center; one or more transceivers configured to enable the one or more processing systems to communicate with one or more remote devices; one or more sensors; and an electrical power distribution subsystem configured to condition a received electrical current to one or more conditioned electrical currents that power the one or more processing systems and the one or more sensors; where the enclosure comprises a cooling system that removes heat from the one or more processing systems and the one or more sensors.

In some implementations, the one or more processing systems and the one or more remote devices are configured for distributed processing. In some implementations, the one or more processors are configured to communicate with one or more external sensors disposed outside the enclosure.

In some implementations, the electrical power distribution subsystem comprises one or more of alternating current (AC) to direct current (DC) converters or DC to DC converters.

In some implementations, the enclosure forms a toroid or near-toroid shape. In some implementations, the enclosure comprises a plurality of modular sectors.

In some implementations, the cooling system comprises a cooling tower configured to cause a convection cooling process inside the enclosure.

In some implementations, the one or more transceivers enable backhaul communication to the one or more remote devices. The backhaul communication comprises high-bandwidth communication to a cloud computing system. The backhaul communication comprises low-bandwidth.

In some implementations, the one or more processing devices comprise an internal management system that provides reconfigurable processing hardware for hosting applications associated with the one or more sensors. In some implementations, the one or more processing devices comprise an internal management system that provides reconfigurable processing hardware for hosting applications associated with the one or more remote devices. The one or more processing devices coordinate with one or more additional processing devices of another configurable data center platform. The one or more processing devices are configured to locally process data received from the one or more sensors to generate processed data and to transmit the locally processed data to the one or more additional processing devices.

In some implementations, the configurable data center platform includes a power meter that measures power distributed to each of the one or more sensors and each of the one or more processing devices. The received electrical current is received from a low voltage power distribution grid.

In some implementations, the enclosure comprises a weather shed. At least one of the one or more processing systems is remotely configurable by the one or more remote devices in response to receiving access credentials associated with the one or more remote devices. One or more processing devices, the one or more sensors, and the one or more transceivers are configured to operate in an environment between −40° C. and 70° C.

In some implementations, the support structure comprises one of a utility pole, a building façade, or a street light.

In some implementations, the electrical power distribution subsystem conforms to one or both of IEC 61850-3 and IEEE 1613 standards.

In some implementations, the one or more sensors comprise one or more of acoustic sensors, vibration sensors, automotive sensors, chemical sensors, electrical sensors, magnetic sensors, wireless sensors, flow sensors, fluid velocity sensors, sensors configured to measure position/speed/acceleration of passing vehicles, optical/imaging sensors, pressure sensors, force sensors, level sensors, thermal sensors, proximity/presence sensors such as motion detectors, environmental sensors, wind-speed sensors, hygrometers, and radio frequency identification (RFID) detectors.

In some implementations, at least one of the one or more processing systems is remotely programmable by the one or more remote devices to run an application downloaded from the one or more remote devices. In some implementations, at least one of the one or more processing systems is configured to be remotely programmable by the one or more remote devices using an application downloaded from the one or more processing systems.

In some implementations, the cooling system comprises at least a portion of the enclosure. The cooling system comprises one or more heat sinks attached to internal components and exposed outside the enclosure. In some implementations, the cooling system comprises one or more heat sinks forming part of the enclosure. In some implementations, the cooling system comprises is in thermal communication with the support structure. In some implementations, the cooling system comprises a mounting bracket that affixes the housing to the support structure. In some implementations, the cooling system comprises one or more sun shades configured to obstruct the enclosure from sunlight. At least one of the one or more sun shades is temperature-sensitive, where the at least one of the one or more sun shades is configured to pass an amount of light that is inversely proportional to a temperature of the at least one of the one or more sun shades. In some implementations, the cooling system comprises one or more sun shades, and where an air gap exists between a sun shade and enclosure that is configured to cause cooling air convection in the air gap. In some implementations, the cooling system additionally comprises one or more heat sinks exposed in the air gap.

Two or more of the features described in this disclosure, including those described in this summary section, may be combined to form implementations not specifically described herein.

The details of one or more implementations are set forth in the accompanying drawings and the description below. Other features, objects, and advantages will be apparent from the description and drawings, and from the claims.

DESCRIPTION OF THE DRAWINGS

Like reference symbols in the various drawings indicate like elements.

DETAILED DESCRIPTION

Figure 1:
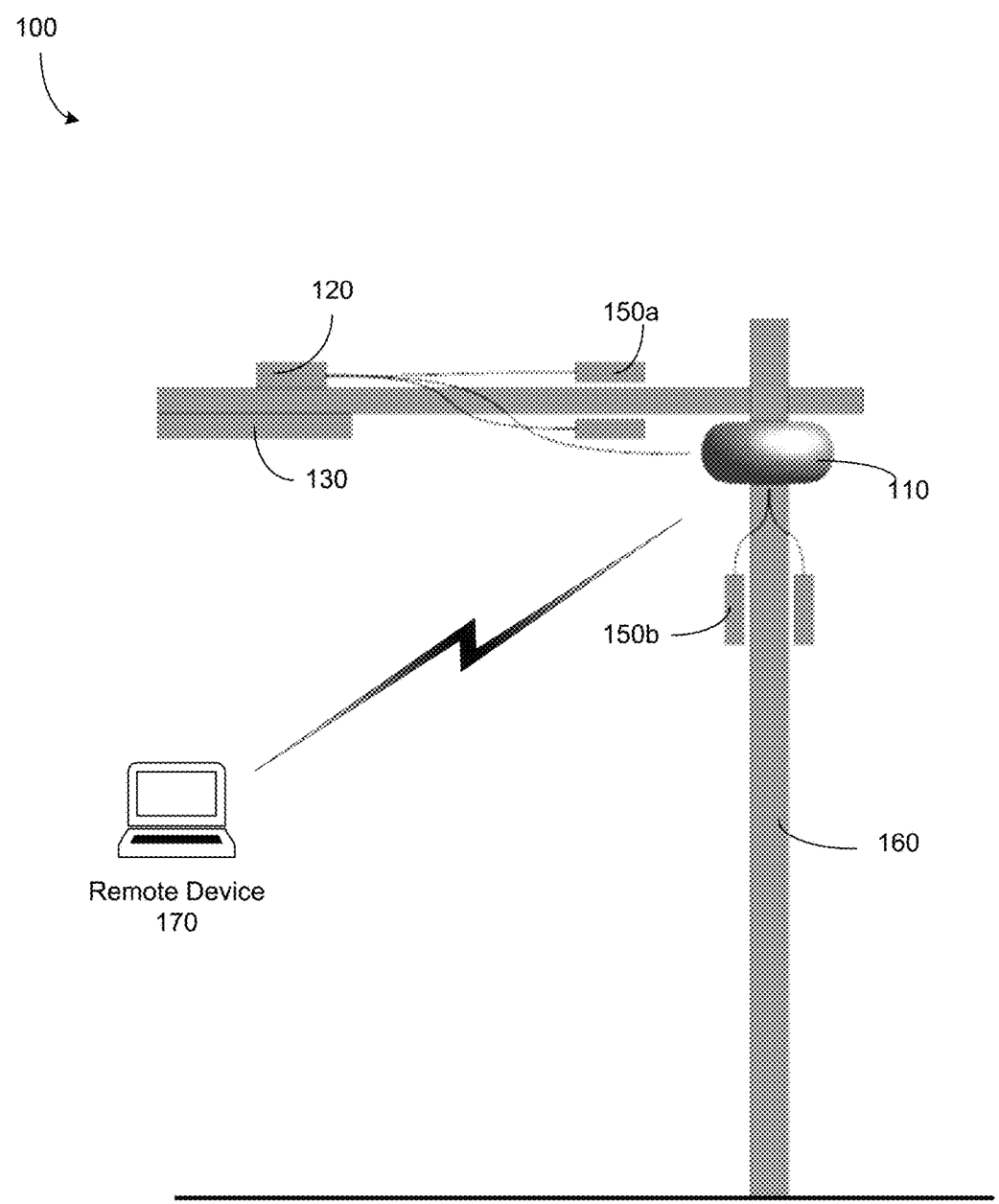
FIG. 1 shows an example of a near sky environment including a data center platform.

This document describes a configurable data center facility and data center designed purposefully to function effectively in the near-earth environment called "the near sky." The near sky is a portion of the earth's atmosphere that is reachable by wired power from one or both of terrain or a structure, overhead of pedestrians and ground vehicles, and below air traffic. In some implementations, the near sky environment has evolved from civil infrastructure. For example, a near sky environment can include one or more of a street light, utility poles (e.g., telephone/telecom poles), building façade, traffic signal, power line infrastructure, street sign, trees, water towers, a tethered balloon, and so forth. The configurable data center facility of the near sky environment includes a power, computation, and communications hub. The configurable data center facility provides reliable power, communication, and shelter in a standard format. The configurable data center facility enables systems that have previously been installed in discrete power and communications silo systems on civil infrastructure to be modular additions to a unified data center platform. This reduces/eliminates the need for newly added IT workload equipment in the near sky environment to be self-sufficient for power, communication, and housing needs, which can result in redundant systems installed near one another. Rather, the configurable data center facility provides an environment that enables installation of systems of many different users (e.g., commercial users with unknown hardware) in a standardized, unified computing platform.

Optimized usage of the near sky includes apparatuses and techniques tailored to the environment. This document describes a data center facility tailored for effectiveness in the near sky, which may be used to provide essential inputs and services to IT workload equipment, thereby creating a data center specialized for operation in the near sky.

A data center facility is distinct from a data center. A data center facility provides essential inputs to IT workload equipment (perhaps tenant-owned) such as shelter, power and cooling, but does not imply ownership, management or operation of the IT workload equipment, or of processes running on that equipment. A data center includes an integrated data center facility and IT workload equipment as a single entity. The configurable data center facility described herein (also referred to as a data center platform) exploits features of the near sky environment, such as power availability, geography, and elevation, and mitigates hazards of the near sky environment, such as weather hazards, as described further detail below.

Components of the data center platform are selected and configured to operate in the harsh near sky environment, which presents input power anomalies, temperature extremes, high and low humidity, salt air, particulate pollution, sand and dust storms, hail, rain, snow, high wind. These features may be embodied by conforming to published and de facto industrial standards for temperature and humidity (typically quoted as −40 C to +70 C, 90% relative humidity non-condensing), automotive standards for shock and vibration loads, ingress protection levels such as IP66, electrical utility standards for grid apparatus such as IEC 61850-3 and IEEE 1613, selection of non-static materials such as the commercial product Kynar, use of robust earthing methods to reduce electrical field gradients, design for low effective projected area.

Referring to FIG. 1, an example of a near sky environment 100 is shown. The near sky environment 100 includes the data center platform 110, which is mounted on a structure 160. The structure 160 supports other devices. In some implementations, the structure 160 supports a powering and metering device 120, a light fixture 130, and other devices 150*a*, 150*b* that can require electrical power, data communication, etc.

The data center platform 110 is mounted on the structure 160. An example bracket that enables the data center platform 110 to mount to varying structure 160 sizes and geometries is described in relation to FIG. 6, below. The data center platform 110 is typically elevated with respect to the ground such that the data center platform 110 is out of reach of pedestrians and other traffic nearby the data center platform.

The structure 160 can include any elevated structure capable of receiving terrestrial power. For example, the structure 160 can include one or more of a street light, traffic light support, street sign or billboard, utility pole (e.g., a telecom pole), building façade, tree, tethered balloon, water tower, or other such structure. The structure 160 enables the data center platform 110 to be elevated and also to be near to physical locations in which housing a computing device, sensors, etc. is useful. For example, a traffic management operator can install one or more sensors in a data center platform 110, enabling surveillance/monitoring of traffic flows in an urban environment. In some implementations, the data center platform 110 is networked to one or more other data center platforms, as described in detail in relation to FIG. 10, below. The one or more other data center platforms can also be mounted on structures similar to structure 160, providing an environment for a distributed, networked data center.

The data center platform 110 includes a physical shelter for housing IT workload equipment and associated sensors, as described below in relation to FIG. 2. The data center platform 110 receives power (e.g., from a local application or directly from a power distribution grid) for powering the components inside the housing of the data center platform 110. In some implementations, the physical shelter is modified in appearance to match a local environment, such as to match a building façade, blend into a utility pole or streetlight, and so forth. The housing can be made to look aesthetically pleasing so as to appear inconspicuous and to avoid disrupting the aesthetic of a city center.

The location of the data center platform 110 in the near sky environment enables several advantages over conventional silo system deployment, which typically includes one or more discrete single-purpose silo systems, such as surveillance systems. The data center platform 110 can be constructed from lightweight materials because the components are out of reach from potential vandals. The elevated position of the data center platform 110 increases exposure to the sky and enables a larger variety of transceivers/data protocols to be used. For example, many types of radios can be interchanged for both local data collection and low or high bandwidth backhaul. For example, low-power wide area networks (WAN) can be used, such as LoRa, mesh networks (Zigbee or other IEEE 802.15.4 networks), satellite communications, airborne relays, and so forth. The data center platform 110 has a superior line of sight between nodes (e.g., between one or more instances of the data center platform 110), relative to ground-based systems. In some implementations, the data center platform 110 communicates to a cloud computing system, such as a cloud-based server system.

The data center platform 110 can be installed either densely (e.g., on each streetlight or utility pole), or sparsely as needed, depending on the required applications. For example, additional instances of the data center platform 110 can be added to a network (e.g., network 1000 of FIG. 10) to scale up functionality as needed and reduce the number of clients at each data center platform 110 of the network.

The data center platform 110 are positioned near to a power source, such as a power distribution grid. There is therefore sufficient power, either passed through directly to systems of the data center platform 110 or through a power conditioning module, for a number of sensors and for high-power applications. Incoming power can be metered for billing or chargeback purposes, and outgoing power can be remotely controlled to support revenue applications.

The data center platform 110 can passively detect nearby devices, such as by tracking Media Access Control (MAC) addresses, to analyze traffic patterns and individual traffic trajectories in a network. The data center platform 110 can be a part of a distributed computing network that serves distributed clients, performing processing locally where needed and aggregating results when needed. For example, analytics of sensors of a network of data center platforms can be processed locally at each data center platform 110, reducing network use of the backhaul (e.g., by sending post-processed results instead of raw data).

The components of the data center platform 110 include extended-temperature components for increased mean-time between failures. For example, the components can be configured to operate between temperatures of between approximately −40° C. to +70° C.

The geometry of the housing of the data center platform 110 itself is constructed to reduce effects of wind (as described in further detail with respect to FIGS. 3A-3B) and enables a larger volume for housing components, relative to silo systems, with a smaller effective projected area (EPA) than the silos, reducing wind/environment effects on the data center platform 110 and allowing more components to fit inside of the data center platform 110. For example, a toroidal shape (described in further detail with respect to FIGS. 3A-3B) can enable components such as AC-DC power supplies, which require a large housing, to fit inside the data center platform 110 without causing the EPA to increase substantially. A large EPA requires a stronger mounting structure and a thicker housing than a data center platform 110 with a smaller EPA, which can increase the cost of the data center platform 110 and decrease the space available inside the data center platform 110 for additional components. The large EPA increases effects of environmental processes on the data center platform 110, such as wind, rain, snow, etc.

The near sky environment 100 can include a remote device 170. The remote device 170 (e.g., client device) can include a computing device configured for wired or wireless communication to the data center platform 110, such as a desktop/laptop, mobile phone, tablet, meter, GPS receiver, wearable device, etc. As described in relation to FIG. 2, below, the remote device 170 (or remote devices) can access one or more processing devices of the data center platform 110, such as to communicate with and/or configure the one or more processing devices.

Figure 2:
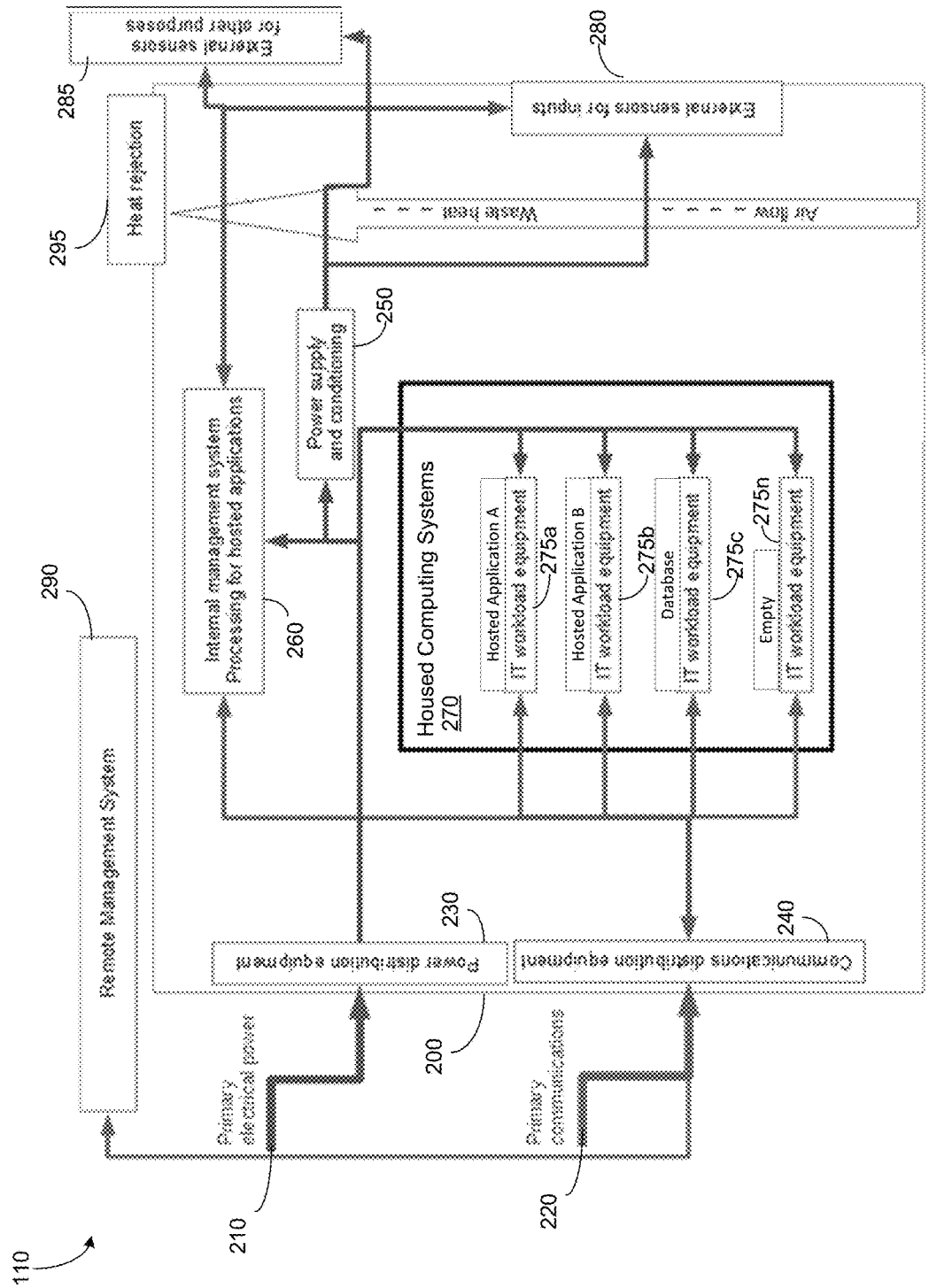
FIG. 2 shows a block diagram of example components of a data center platform.

Turning to FIG. 2, the data center platform 110 operates as a data center facility. The data center platform 110 is configurable to integrate with the near sky environment 100 of the data center platform and also modular to integrate with one or more additional data center platforms that are a part of the near sky environment. The data center platform 110 includes subsystems for performing operations that include providing quality power distribution, internal environmental control, external communications, physical security, shelter, and monitoring & reporting IT workload equipment metrics.

As described above in relation to FIG. 1, the data center platform 110 includes a housing 200 (also called a chassis) that physically houses the hardware components (e.g., housed IT workload equipment 270) of the data center platform 110 and provides a mounting base for sensors (e.g., sensors 280, 285). The sensors can be either/both external to the housing 200 (such as sensor 285) or inside of the housing (such as sensor 280). Though two sensors 280, 285 are shown, any number of sensors can be added that can be supported by systems of the data center platform 110 (e.g., systems 275*a-n*). The exact number of sensors 280, 285 can depend on the kind of sensors being used, and may vary depending on physical size, power, and data requirements. The housing provides physical security to the components of the data center platform 110. For example, the housing provides shelter from the near sky environment 100, such as from cold, heat, rain, humidity, fire, theft, and so forth. Security is partially ensured by the physical location of the data center platform 110 as elevated from reach of passerby, but the housing 200 can be locked closed and locked to the structure 160 for increased security. As described in greater detail with respect to FIGS. 8A-9, sensors can be mounted both external to the housing 200 and inside the housing. Mechanical support is provided for industrial connectors for one or more sensors, enabling modular "plug and play" functionality for commercial off-the-shelf sensors. Various wired and wireless protocols are supported for communicating with the sensors 280, 285 via the data center platform 110, including but not limited to Bluetooth, Zigbee, TCP/IP, SMS, Modbus, etc. and which support their respective network protocols. The protocols supported by the data center platform 110 can include additional protocols depending on the sensors 280, 285 and hosted applications that are installed.

The housing 200 includes a heat rejection system 295. The heat rejection system 200 processes waste heat from the data center platform 110. As further described in relation to FIGS. 4-5, the heat rejection system can result from a shape of the housing 200 itself. In some implementations, the heat rejection system 200 includes additional systems, such as fans, water cooling pumps, and so forth. The waste heat is expelled from the data center platform 110 ensure that an internal temperature of the data center platform 110 does not rise above preferred operating levels (e.g., approximately 70° C.).

The heat rejection system 295 can include one or more heat sinks (not shown) that remove heat from the housed computing systems 270 and other components inside the housing 200. In some implementations, the housing 200 is configured to be a heat sink. One or more processing systems are mounted on or in thermal communication with the housed computing systems 270. For example, metal contacts can pipe heat waste away from the housed computing systems 270. The heat sinks can be thermally coupled to the housed computing systems 270 and exposed to the environment exterior to the housing 200. For example, aspects of the atmosphere (e.g., rain, wind, snow, etc.) can be used to cool the heat sinks of the data center platform 110 without requiring any moving parts (e.g., fans, water pumps, etc.) inside of the housing. In some implementations, the structure 160 is thermally coupled to the heat rejection system 295 and draws waste heat away from the housed computing systems 270, acting as a heat sink. For example, if the data center platform 110 is mounted to street light pole, the street light pole can serve as a heat sink that is coupled to the heat rejection system 295, such as by external contacts on the housing 200 that are thermally coupled to the heat rejection system. In some implementations, the heat rejection system 295 is coupled to a mounting bracket of the data center platform 110, and the mounting bracket serves as the external contact with the structure 160 for removing waste heat. The heat sink exterior to the housing 200 can be oriented to be exposed to prevailing atmospheric air currents exterior to the housing.

The data center platform 110 includes its own power, computation, and communications capability, separate from that of any IT workload equipment installed at the data center platform 110. The data center platform 110 includes a power subsystem 210. The power subsystem 210 includes power distribution equipment 230 that receives a power input from an external source and distributes power to one or more systems inside the data center platform 110. The power subsystem includes a power conditioning system 250 that conditions the power input for use by housed workload equipment 270 and one or more external sensors 280, 285 that can interface with the data center platform 110.

The power distribution equipment 230 receives power from an external source, such as from an electrical grid. In some implementations, the power distribution equipment 230 receives power from power distribution lines, such as receiving medium or low AC voltage (e.g., approximately 120V or 240V) at a secondary distribution level of a power grid. The power source can include a service drop that is typically used to power existing infrastructure, such as streetlights, traffic lights, etc. In some implementations, the electrical power distribution subsystem conforms to one or both of IEC 61850-3 and IEEE 1613 standards.

The power distribution equipment 230 distributes the power received as pass-through power, or converts the power to conditioned AC/DC power by sending to a power conditioning system 250 of the power subsystem 110. The power conditioning system 250 ensures that power quality is maintained at the data center platform 110 to ensure reliable functionality of as the housed IT workload equipment 270. For example, the power conditioning system 250 ensures that no housed IT workload equipment 270 is damaged by unreliable power input. Further, the power conditioning subsystem 250 meters the power usage of various housed workload equipment 275a, 275b, 275c, and 275n (hereinafter systems 275a-n). The power conditioning equipment 250 provides an uninterruptable power supply (UPS) functionality. The power conditioning equipment 250 provides surge/spike suppression and suppresses total harmonic distortion in the received power signal. The power conditioning equipment reduces ripple currents, stabilizes frequency of AC current, and reduces/monitors holdup time. The power conditioning equipment 250 is configured to power sensitive, low power electronics (e.g., <5V DC) and includes hardware for bumpless switching of AC output voltages. The power conditioning equipment 250 can include Alternating Current (AC) power supplies, Direct Current (DC) power supplies, AC-DC power supplies), and DC-DC power supplies that provide DC output at several different voltage levels as needed by the housed IT workload equipment 270. For example, the conditioning equipment can provide 1V, 5V, 12V, 24V, etc. DC output. In some implementations, the power conditioning equipment 250 provides power over Ethernet (POE) to one or more systems 275a-n of the housed IT workload equipment 270. The power conditioning equipment 270 can provide power at appropriate levels for used by the systems 275a-n of the housed IT workload equipment 270 (e.g., 15 W, 33 W, 60 W).

Power output can be provided to housed IT workload equipment with a connector that is in accordance with power standards used in the country in which the data center platform 110 is deployed. For example, in the United States, the electrical connector and the corresponding receptacle can be in accordance with standards set by National Electrical Manufacturers Association (NEMA). For example, a power connector can include one of a NEMA 5-15 3-pin connector (commonly used in North America), a CEE 7/16 Europlug (common in Europe), and a BS 1363 connector (Britain). Other examples include USB (which can provide power, communications, or both), 2.5 millimeter connectors commonly used on electronics, terminal block connectors for hand wiring. The connector may be used to relay power for powering both the housed IT workload equipment 270 and associated sensors 280, 285. In some implementations, the connector may be used for controlling power to a streetlight. In some implementations, the connector is bypassed, and the data center platform 110 receives raw power from the distribution grid for power supply conditioning by system 250.

The data center platform 110 includes a communications subsystem 220. The communications subsystem 220 includes communications hardware (e.g., one or more transceivers, antennae, etc.) and communications software (e.g., application programming interfaces) for communication by the systems 275a-n of the housed IT workload equipment 270. The communications subsystem 220 includes communications distribution equipment 240 that networks the modules of the data center platform 110 together and enables the systems 275a-n to communicate with each other and with external systems. For example, the communications subsystem 220 can include hardware for high-bandwidth (e.g., Gigabit) backhaul to the Internet. The communications subsystem 220 can include hardware for high-speed communication (e.g., >100 Mbps) among systems 275a-n and from one instance of the data center platform 110 to another instance over a network (described in greater detail with respect to FIG. 10, below).

The communications subsystem 220 includes circuitry (e.g., one or more transceivers) configured to wirelessly communicate using one or more communication technologies. The communication technologies can include, for example, Wi-Fi, Bluetooth®, ZigBee, iBeacons, near-field communications (NFC), cellular, or other proprietary or non-proprietary technologies. The communications subsystem 220 enables the data center platform 110 to communicate with other systems in the near sky environment 100 (such as devices 150a, 150b elsewhere on the structure 160). The communications subsystem enables communication with other data center platforms located on other structures in the near sky environment 100 (shown in FIG. 1), or to a gateway 1008 on a network 1000 (shown in FIG. 10). The communications subsystem 220 also enables the data center platform 110 to communicate with external devices that are in close proximity to the data center platform 110, such as mobile devices of individuals or other client devices. For example, the data center platform 110 may provide WiFi capability to local devices. In some implementations, the communications subsystem 220 can provide data to nearby client devices in response to data requests (e.g., provide sensor data from one or more sensors 280, 285 installed in/on the data center platform 110). In some implementations, the communications subsystem 220 can receive data from one or more client devices and control operation of one more networked systems as a result. For example, an emergency vehicle may send a control signal to operate a traffic light. In another example, a control signal can be received from a client device and relayed to an associated streetlight controller (e.g., to dim/toggle the streetlight). In another example, surveillance data of a camera installed on the data center platform 110 can be streamed to a nearby client device or transmitted to a remote client device (e.g., remote device 170), such as by using a network 1000 (shown in FIG. 10).

The communications subsystem 220 can include wireless communication, as described above, and/or wired networks for communications. The communications subsystem includes a variety of wired interfaces for transmitting data from the data center platform(s) 110 to external systems elsewhere on the internet. For example, the wired interfaces include fiber optics, Ethernet, etc. The communications subsystem 220 can provide wired backhaul communications to existing fiber optic backbone infrastructure. For example, a data center platform 110 can be wired to telecommunications infrastructure that is existing on a utility pole, near a streetlight, etc. As described in further detail with respect to FIG. 10, a data center platform 110 can include a gateway 1030 to a communications network 1010.

The communications subsystem 220 enables the data center platform 110 to wirelessly communicate with, and/or control, external sensors or devices located on or near the structure 160 supporting the data center platform 110. In some implementations, the data center platform 110 may also communicate with external sensors 280, 285 or devices 150a, 150b located on the streetlight via a wired connection. Communication with these external sensors or devices may allow the data center platform 110 to control operations of the external sensors or devices. In one example, where a system 275a of the housed IT workload equipment 270 includes a traffic sensor, the data center platform 110 may generate a control signal to operate a camera sensor (e.g., sensor 280) disposed on the streetlight responsive to determining a traffic condition such as a traffic back-up. The control signal can be configured to, for example, direct the camera to capture the event and provide a video/image feed to a traffic information server. In another example, where the data center platform 110 includes an audio sensor, the communications subsystem 220 can transmit, upon receiving information indicative of an emergency, an alert signal that is transmitted to law enforcement authorities. In another example, the data center platform 110 may include a weather sensor. Upon receiving an indication from the weather sensor that snowfall is occurring, the communications subsystem can direct an external sensor to measure the snow accumulation or may direct a camera to take a photo of the snow accumulation in a particular area where a measuring stick is located.

In some implementations, information from one or more external sensors may also be routed through internal management system 260. The internal management system 260 provides processing hardware for hosted applications. In some implementations, the internal management system 260 hosts lightweight applications that are installed for $3^{rd}$ party users of the data center platform 110. For example, one or more plugin applications (e.g., Ubuntu snaps, Arduino sketches, Amazon skills, and so forth) can be uploaded hardware hosted by the data center platform 110 (e.g., one or more of systems 275a-n) and run by the internal management system 260. This enables $3^{rd}$ party users to participate in near sky computing, either in a single data center platform 110 or in the network 1000 of data center platforms without requiring the user to purchase and negotiate pole rights/easements, design hardware (e.g., a silo system) for integration with the existing hardware of the near sky environment 100, etc. The $3^{rd}$ party user can simply subscribe to a service associated with the data center platform 110 to access the necessary hardware to run one or more applications of the $3^{rd}$ party user. This configuration of the data center platform 110 enables many users to access the near sky environment 100 simultaneously without requiring a number of silo systems that may have redundant hardware.

The data center platform 110 can be remotely accessed by a client device. In some implementations, the hosted applications of systems 275a-n can be remotely uploaded to the data center platform 110 or remotely downloaded from the data center platform 110 over the air or via a wired connection. For example, an application running on a data center platform 110 may include gathering and storing data from one or more of sensors 280, 285. The sensor data (or processed sensor data that is processed by one or more of systems 275a-n) can be downloaded to a remote device (e.g., remote device 170 of FIG. 1). For example, the remote device (e.g., a client device) may possess administrative rights to one or more of systems 275a-n on a particular data center platform 110 and thus may be permitted to access and configure one or more of systems 275a-n from a remote location. In some implementations, a client device can have administrative rights to only some of systems 275a-n and not others, and can only configure the respective systems to which the client device as access. The client device can provide access credentials or other security data to one or more of the systems 275a-n to gain access to the respective systems. In some implementations, a client device can include subscription data that enables temporary access to one or more of systems 275a-n. When the client device attempts to access the systems 275a-n, the subscription data can be verified by the data center platform 110 as valid and access can be provided, or the subscription data can be identified as expired and access can be denied. Administrative rights to the systems 275a-n can be verified using passwords/login data, biological identifiers, encryption keys, and so forth.

For example, an autonomous taxi service may desire to build a network of sensors in an urban environment to reliably manage the distribution of a fleet of autonomous vehicles. The service can subscribe to use the hardware of the data center platform 110 to collect and process data needed for this and other functions of the service. In some implementations, as described above, the service may install one or more sensors on the data center platform 110 that interface with the computing hardware (e.g., the internal management system 260) of the data center platform 110 to quickly and efficiently establish a network of sensors without the need for customized hardware. In another example, the data center platform 110 downloads a video analytics management application. The data center platform 110 is configured to run the application and control one or more sensors 285 (e.g., video cameras). The data center platform 110 can be configured to store the video data that is recorded locally, in a remote system (e.g., a cloud computing system), in a distributed network of data center platforms, etc.

Information received from the one or more external sensors 280, 285 may be communicated by the data center platform 110 to an associated controller to direct one or more other systems of the near sky environment 100 to operate in a particular way. For example, if a tree is growing in such a way that the tree threatens the power distribution grid, data received from a proximity sensor or a video feed can cause the internal management system 260 to generate an alert that includes relevant data to a maintenance company's database, prompting a scheduling of maintenance/pruning of the tree. Other functions (image processing, filtering, etc.) can be performed locally in the data center platform 110 by hardware (e.g., by systems 275a-n) that are operated by a $3^{rd}$ party but owned by the data center platform 110. Local processing of received data by the sensors (e.g., external sensors 280, 285) reduces network 1000 congestion and reduces bandwidth requirements of surveillance and other such functions.

The housed computing systems 270 include one or more processing devices that can serve as the IT workload equipment 275a-n for the data center platform 110. Each of IT workload equipment 275a-n include one or more processing devices or other computing devices that are used for data center operations. The housing computing systems 270 are accessible for use in one or more applications of the data center platform 110. The housed computing systems 270 can also include other processing devices, data storage, memory, and so forth for performing one or more data center functions.

The IT workload equipment 275a-n can be reprogrammable. In some implementations, the IT workload equipment is reprogrammable from one or more remote computing systems (e.g. remote device 170). The IT workload equipment 275a-n can be reprogrammed with one or more applications that are either downloaded from the remote device 170 or otherwise present in the data center platform 110. For example, IT workload equipment 275a can be hosting application A (e.g., a video surveillance management application). IT workload equipment 275b, meanwhile can host application B (e.g., an atmosphere monitoring application). IT workload equipment 275c, meanwhile, can be serving as a database (or other data storage), a portion of a distributed database, etc. for storing data for one or more other applications. IT workload equipment 275n, meanwhile, may be available for use by another application. While particular examples are given, IT workload equipment can host any combination of applications for processing, storage, or other data center operations in varying proportions.

In some implementations, the housing computing systems 270 form storage for data or portion of a database for storing data. The data center platform 110 can operation in combination with other instances of the data center platform to create a distributed database. The data center platform 110 can store and process data locally that is received from sensors 280, 285. The data center platform 110 can store data in the form of volatile or non-volatile memory, or any combination thereof. The data center platform 110 can exchange data that are stored with other instances of the data center platform, transmit stored data to a remote device 170, or store data received from the remote device or other instance of a data center platform.

While four modules are shown in FIG. 2 for IT workload equipment 275a-n, these represent portions of housed computing systems 270 and can be divisible into any number of modules supported by the housed computing systems 270. The housed computing systems 270 are thus configured to read, store, and analyze data, and control one or more operations as a result of the data that is analyzed.

The IT workload equipment 275a-n of the housed computing systems 270 are also reconfigurable. The communications protocols, hardware settings, and other operational settings of the housed computing systems 270 can be reconfigured for one or more applications either ad hoc or a priori.

In some implementations, the data center platform 110 may communicate with sensors in the vicinity of the structure, but not directly on the structure. In some implementations, the sensor platform may communicate with sensors in/near a parking lot that indicate that the lot is full and should be closed to additional vehicles.

The data center platform 110 includes data center infrastructure management systems, which can be run by the internal management system 260 or a remote management system 290. The data center infrastructure management can include internal monitoring of the data center platform 110 environment. For example, the data center infrastructure management system can monitor and report regarding temperature, relative humidity (RH) values, power usage effectiveness and percent load, etc. The data center infrastructure management system includes external monitoring of the data center platform 110, such as external temperature, chassis temperature, relative humidity, tilt of the chassis, network traffic, power metering, etc. In some implementations, the data center infrastructure management system creates log files which can be transmitted to an external management center. For example, if a system 275a-n fails, an alert can be sent to a remote maintenance center which can generate a scheduled maintenance/replacement of the data center platform 110 or system within. The external sensors 280, 285 can be installed on the data center platform 110 in combination with software (e.g., an application) installed on one of systems 275a-n. The software can be configured to monitor the status of the external sensor 280 to ensure that the sensor 280 is functioning properly. In some implementations, the remote management system 290, which can be located at a centralized control center, can perform monitoring functions for one or more data center platforms of a network (e.g., network 1000 of FIG. 10).

Figure 3A:
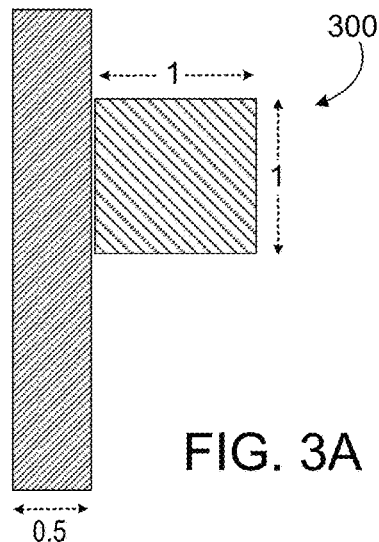
FIGS. 3A-3B show example data center platform geometries.
Figure 3B:
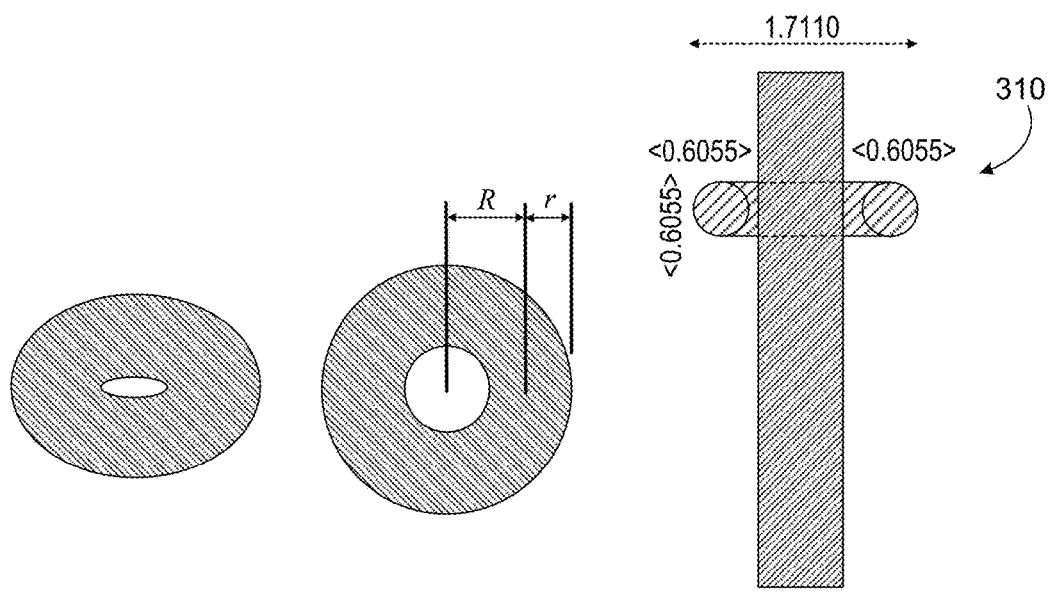

Referring to FIGS. 3A-3B, example geometries are shown for the data center platform 110. FIG. 3A shows a cube-shaped housing 300. FIG. 3B shows a toroidal-shaped housing 310. Toroidal housing 310 has a 30% smaller effective projected area (EPA) than square shaped housing 300 that has an approximately equivalent volume. The reduced EPA of the toroidal housing results in reduced wind effects in the near sky environment 100 and allows larger components to be included in the housing 310 without increasing adverse effects from wind and other environmental effects. Maximizing volume while minimizing EPA allows larger components, such as IT workload equipment, ADCs, and other subsystems of FIG. 2 to be included in a data center platform 110 that is a single, unified hub. The toroidal shape of the data center platform 110 has a center of gravity on the structure to which the data center platform 110 is mounted, and reduces stresses on the housing 200 and bracket system (described below in relation to FIG. 6).

Figure 4:
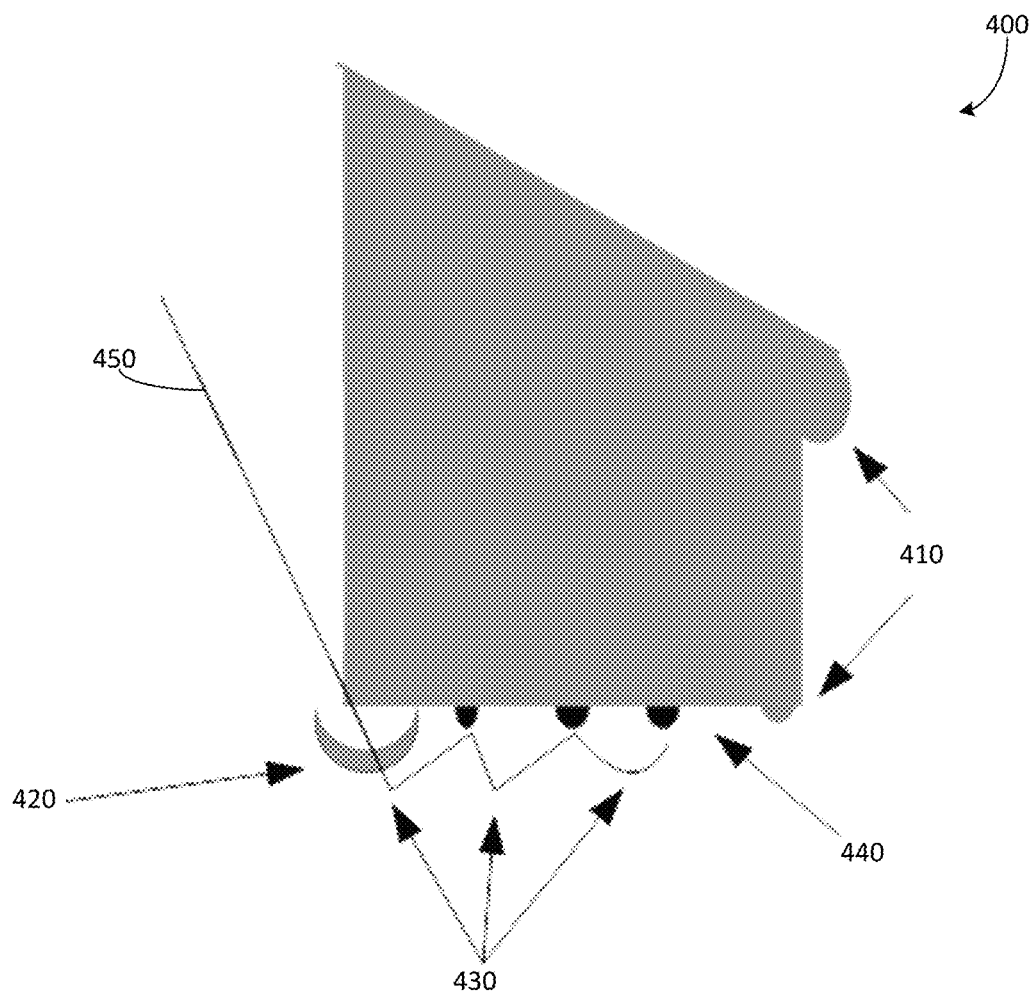
FIG. 4 shows a cross section of a data center platform.

Turning to FIG. 4 a cross-section of an example data center platform 400 is shown. The data center platform 400 includes weather sheds 410 both on a top of the data center platform 400 and on the bottom of the data center platform. The weather sheds allow runoff of debris, precipitation, etc. from the data center platform. A cable guide 420 receives a cable 450 from a remote location and guides the cable into one or more bottom connectors, such as connector 440. The cable 450 forms drip loops 430, allowing precipitation to drip off of the cable 450 and ensuring that moisture does not drip into the interior of the data center platform 400. The weather shed 410 can enable rain, snow, and other precipitation to runoff the housing 200 and reduce force (e.g., torque or other mechanical force) on the housing, increasing durability of the data center platform 110.

Figure 5:
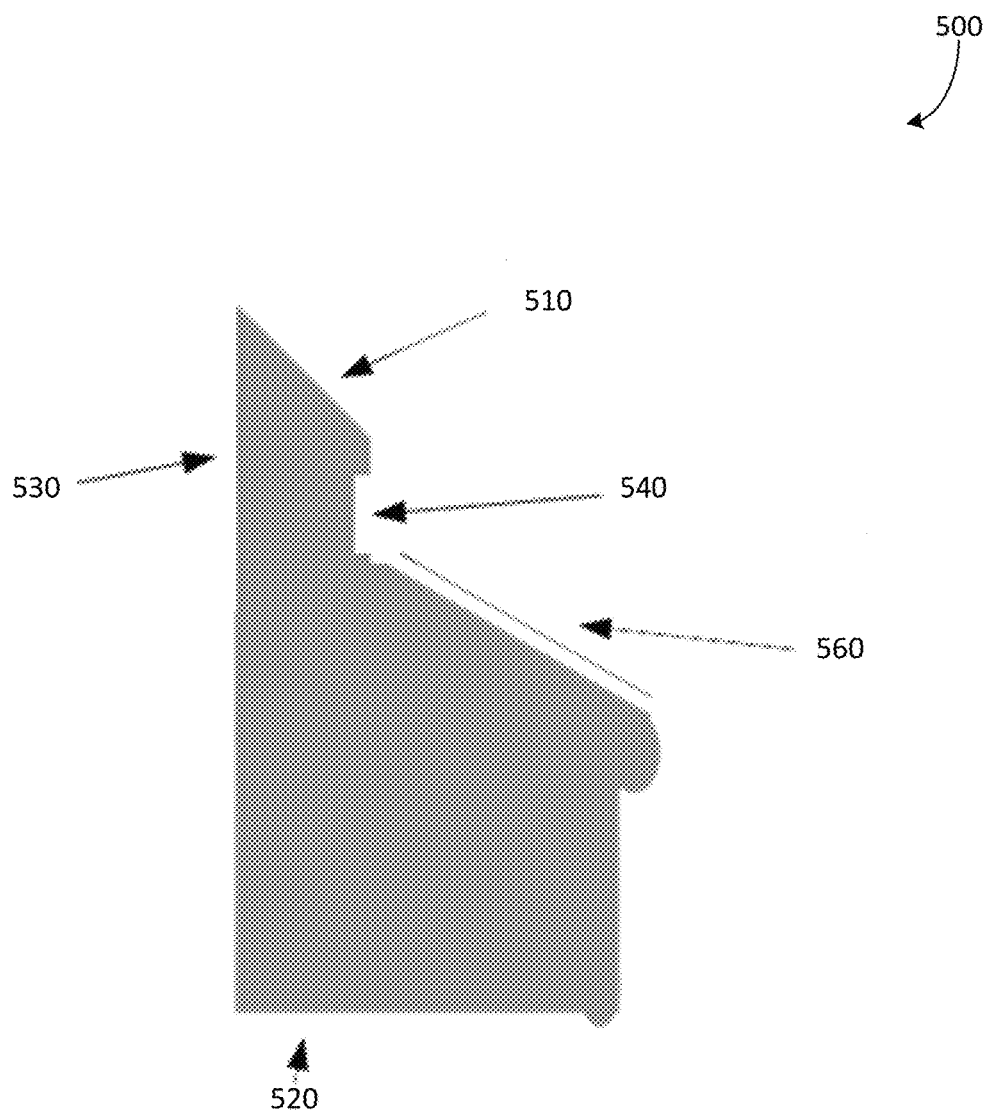
FIG. 5 shows a cross section of a data center platform.

Turning to FIG. 5, a cross-section of an example data center platform 500 is shown. A cooling tower 510 extends from the data center platform 500. The tower 510 absorbs heat (e.g., by the sun in the near sky environment) and draws up air through ventilation intake holes 520 in the bottom of the data center platform 500. Ventilation holes are included on one or both sides 530, 540 of the cooling tower 510 to allow warmer air to escape from the data center platform 500. The tower 510 thus causes convective cooling of the interior of the data center platform 500 through its geometry. Components that are more sensitive to heat can be placed near the bottom of the data center platform 500, while components resistant to heat can be placed closer to the tower 510 or inside the tower. This configuration enables cooling of the data center platform 500 without any moving parts for cooling the data center platform. This increases reliability of the data center platform 500 relative to conventional data centers, which often require extensive HVAC for cooling systems.

In some implementations, a sun shade 560 can be placed on the data center platform 500 to reduce heat absorption by the body of the data center platform. The sun shade is configured to obstruct sunlight from reaching the housing. In some implementations, the shade can comprise a power generating surface, such as a solar cell, to augment a power supply of the data center platform 500 or power one or more external devices of the data center platform. As stated in relation to FIG. 2, the housing 200 itself can serve a heat sink which is cooled by environmental factors (wind, rain, etc.).

In some implementations, a sun shade 560 (or plurality thereof) is temperature-sensitive. The sun shade 560 can be configured to pass variable amounts of light to the housing, such as an amount of light that is inversely proportional to a temperature of the sun shade. In some implementations, the sun shade 560 comprises a solar cell that is configured to provide power to the data center platform 110. In some implementations, an air gap exists between a sun shade 560 and housing 200. The air gap is configured to cause cooling air convection in the air gap from the housing, cooling the housing. A heat sink (not shown) can be placed in the air gap so that the heat sink is cooled by an airstream in the air gap. For example, one or more blades of the heat sink can be configured to be exposed to a convection air current in the air gap.

Figure 6:
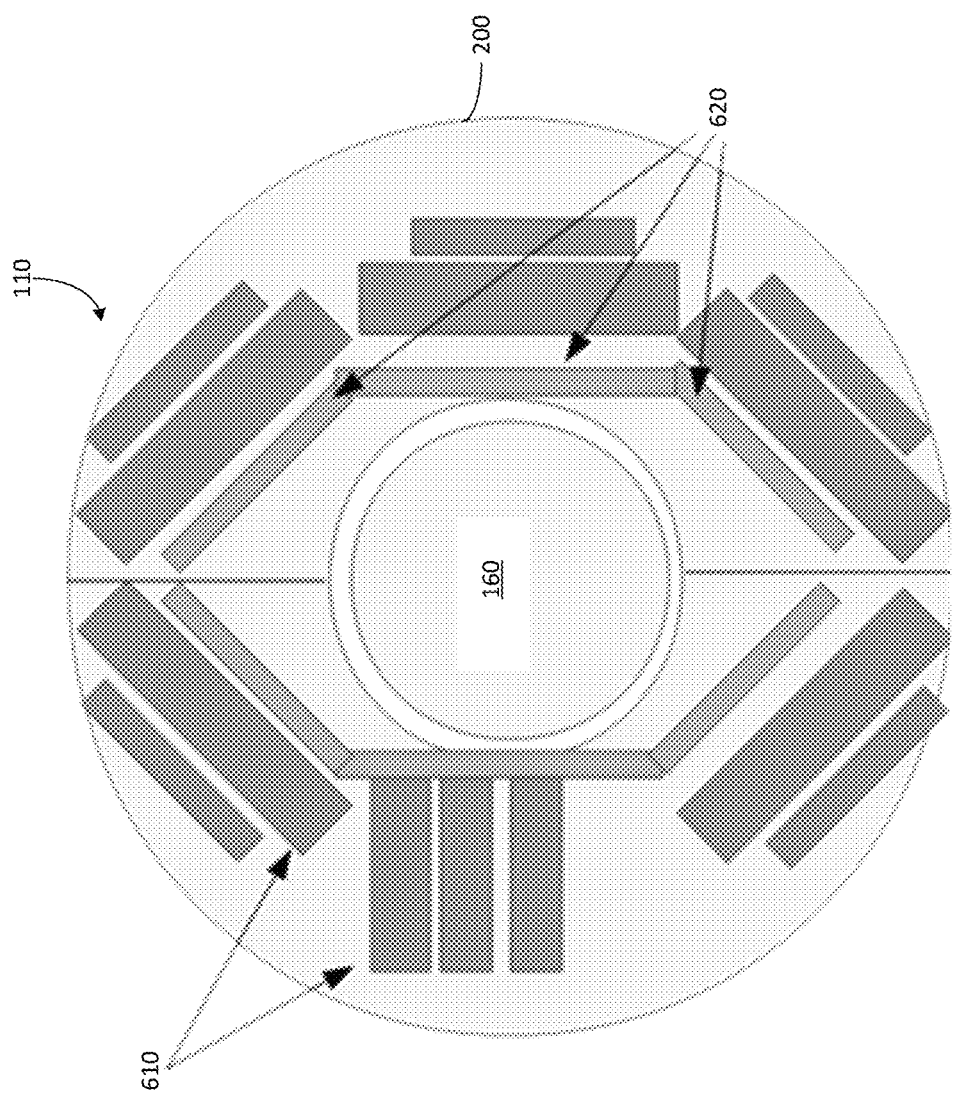
FIG. 6 shows a top view of a data center platform mounted on a structure.

Referring to FIG. 6, a top view of a data center platform 110 mounted to the structure 160 is shown. As described above in relation to FIGS. 3A-3B, the housing 200 can be a toroid or near-toroid in shape to increase internal volume while reducing EPA. DIN rail 620 can be affixed to the interior of the data center platform 110. The DIN rail 620 can be segmented so that components 610 can be mounted inside of the data center platform 110. The data center platform 110 can be mounted to structure 160 such that the data center platform 110 circumscribes the structure. This causes a center of gravity of the data center platform 110 to be over the structure, reducing torque on one or more portions of the housing. The housing 200 is configured to be adjustable to varying sizes of structure such that the housing can be mounted on structures 160 of different diameters. In some implementations, if the structure is flat (e.g., if the structure is a building), the housing shape 200 can be adjusted to conform to the surface of the structure. For example, a half-toroid (or other size segment of the toroid) can be used in lieu of the entire toroid. In some implementations, other shapes of the housing 200 can be used to enable mounting to a structure 160 of various shapes and sizes.

Figure 7:
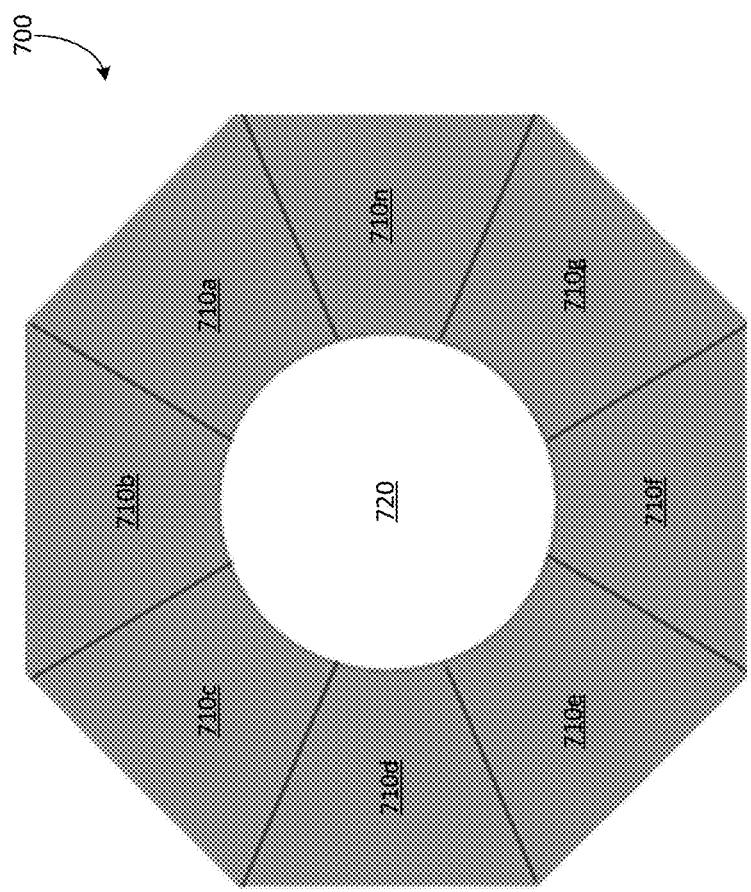
FIG. 7 shows a top view of a data center platform comprising modular sections.

Referring to FIG. 7, a top view of a data center platform 700 is shown that includes sections 710a-n. Each section 710a-n can be individually removed or added to the data center platform 700. For example, each of the sections 710a-n can be optimized for a particular function, such as power, communications, computation, etc. Different modules can be added to the data center platform 700 in varying numbers to maximize the utility of the data center platform 700. For example, if a power intensive application is needed, a communications module can be swapped for a power module. The sections 710a-n are each mounted to a structure 720 and to each other.

The sections 710a-n can each be removed/replaced to adapt to conditions of the near sky environment 100. For example, when a utility pole is being replaced, a new utility pole is constructed adjacent to the utility pole that is being replaced. Sections 710a-n that obstruct construction of the new pole can be temporarily removed or moved on the pole to create space for the new pole.

The sections 710a-n are modular, and the data center platform 700 can include a complete or partial toroid or near-toroid shape that is formed from the sections 710a-n. In some implementations, each section 710a-n can be individually removed and replaced without disrupting functionality of the remaining sections. While eight sections 710a-n are shown, any number of sections can be used to form the toroid or near-toroid of the data center platform 700.

In some implementations, the sections 710a-n can be stacked on top of one another. In this way, portions of the data center platform 700 or the entire data center platform can be stacked for additional space. In some implementations, one or more sections 710*a-n* are specially modified when data center platforms are stacked. For example, a top layer can include a cooling tower (e.g., tower 510 of FIG. 5) or weather sheds (e.g., weather sheds 410 of FIG. 4), while a bottom layer can have a flat top that interfaces with the top layer.

Figure 8B:
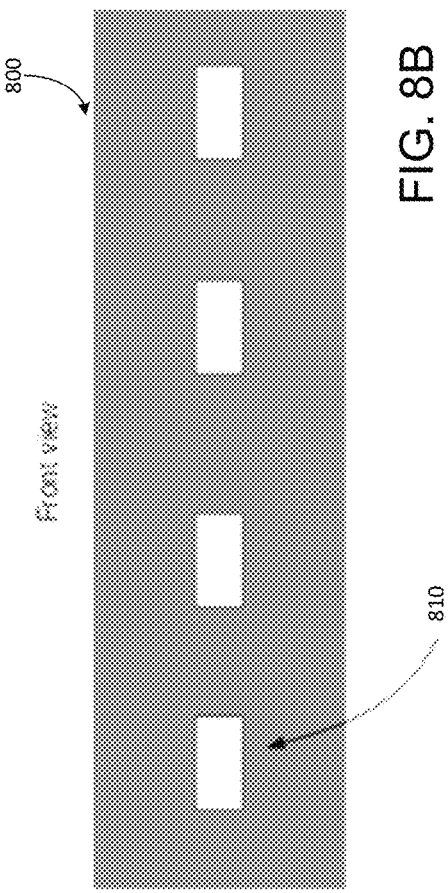
FIGS. 8A-8C show end, front, and top views, respectively, of a mounting bracket.
Figure 8C:
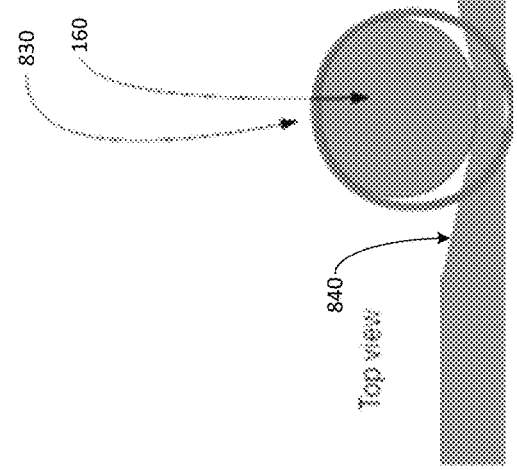
Figure 8A:
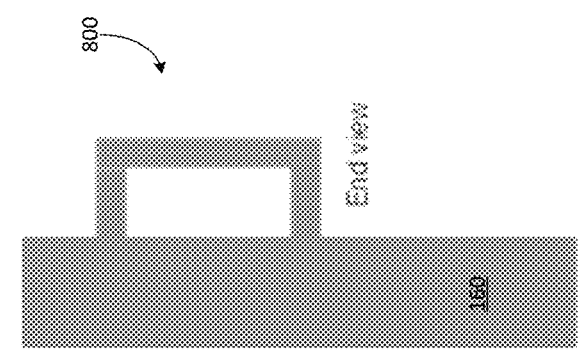

Referring to FIGS. 8A-8C, a bracket 800 is shown for mounting the data center platform 110 to the structure 160. FIG. 8A shows an end view of the bracket 800 and structure 160. The bracket 800 includes one or more holes 810, seen in FIG. 8B. The bracket 800 mounts to the structure 160 using a hose clamp 830, seen in FIG. 8C. The hose clamp 830 extends through two of the holes 820 around the structure 160. The bracket 800 includes a U-channel with a V-cut 840. As described above in relation to FIG. 6, the housing 200 can be adjusted to mount to structures of various shapes and sizes such that any structure that can support the weight of the housing 200 can be used.

Figure 9:
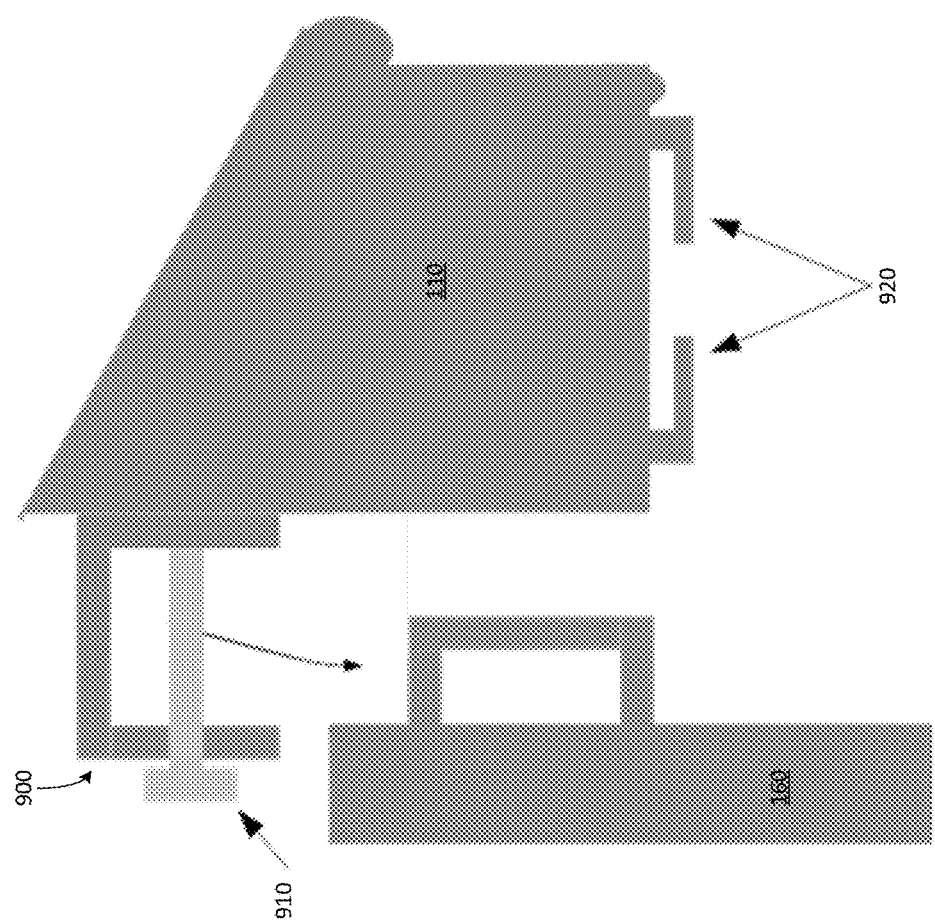
FIG. 9 shows a side view of a data center platform and mounting bracket.

Referring to FIG. 9, the bracket 800 interfaces with a mounting bracket 900 of the data center platform 110. A bolt 910 can be used to fasten the mounting bracket 900 to the pole bracket 800. The brackets 800, 900 enable an adjustable, flexible mounting system for mounting the data center platform 110 to structures 160 of various shapes and sizes. Though a particular bracket system has been described, any such mounting system can be used to fasten the data center platform 110 to the structure 110.

The data center platform 110 can include one or more external brackets 920 for mounting additional sensors (e.g., sensors 280, 285 of FIG. 2). The additional sensors enhance the ability of the data center platform 110 to gather information on conditions at or near the structure 160. The information gathered would depend on the particular sensors deployed in the data center platform 110 and installed external to the data center platform 110 and may include, for example, pollution conditions, traffic conditions, pedestrian traffic information, safety conditions, or other environmental conditions. The sensors may be disposed, for example, in a sensor module of the data center platform 110. The individual sensors included in the data center platform 110 may be selected by an authority or user in charge of the deployment. For example, the sensors on the data center platforms 110 to be deployed in a particular city may be selected by the corresponding municipality, based on the conditions desired to be monitored. The sensors that may be deployed in the data center platform 110 can include, for example, environmental sensors, carbon monoxide sensors, carbon dioxide sensors, noise sensors, seismic sensors, threat sensors, radioactivity sensors, biochemical sensors, contact sensors, motion sensors, parking sensors, traffic counters, or pedestrian counters. Types of sensors that may be included in the sensor platform include, for example, acoustic sensors such as microphones, vibration sensors such as seismographs, automotive sensors, chemical sensors such as carbon monoxide or carbon dioxide detectors, electrical sensors such as ammeters and voltmeters, magnetic sensors, wireless sensors, flow sensors, fluid velocity sensors, sensors configured to measure position/speed/acceleration of passing vehicles, optical/imaging sensors such as cameras or number-plate readers, pressure sensors such as barometers, force sensors, density and/or level sensors, thermal sensors, proximity/presence sensors such as motion detectors, environmental sensors, wind-speed sensors, hygrometers, and radio frequency identification (RFID) detectors. In some implementations, one or more sensors may be deployed on the streetlight, but not on the sensor platform. In such cases, the sensors external to the sensor platform can be configured to communicate with the sensor platform over wired or wireless connections.

Different combinations of sensors may be deployed in the data center platform 110 based on particular concerns in certain areas. For example, threat sensors, like biochemical sensors or radioactivity sensors, may be included in the data center platforms 110 to be deployed on structures close to an airport, a stadium, or a large public gathering space. In such cases, the sensors could gather safety information to be relayed to police or other public safety officials. In another example, traffic sensors may be included in the data center platforms 110 to be deployed on structures 160 close to busy roads or high traffic areas. As other examples, motion sensors and parking sensors may be included in the data center platform 110 to be deployed on structures 160 in parking lots, and noise sensors may be included in the data center platforms 110 to be deployed structures 160 in residential areas. In some implementations, the data center platform 110 may also be portable such that the data center platform 110 can be removed from one structure 160 and installed on another as desired. This may be advantageous when data gathered from the sensors would be useful in a particular area of a city at a particular time, for example, for a special event. In one particular example, if a city or municipality owns a limited number of data center platforms 110 (e.g., platforms including traffic and parking sensors), the platforms can be deployed on compatible structures at one location for a particular event, and then moved to compatible structures at a different location for another event. Because the data center platforms 110 can be deployed with or without additional equipment, the portability is independent of whether or not the compatible structures include such equipment.

A configurable sensor platform may also allow for controlling other devices that may be located at or near the streetlight. For example, the data center platform 110 can be configured to communicate with an external camera, and may direct the camera to point in a certain direction or to start or stop recording based on one or more control signals received from data center platform 110. Such a control signal can be generated based on the output of one or more sensors disposed on the data center platform 110. Information gathered by the sensors of the co-located data center platform 110 may also be communicated over the network 1000 and analyzed at an external computing device or server, for example, by police, government, or another party. In some implementations, the data center platform 110 may communicate information over a communication network 1010 (as seen in FIG. 10), utilizing a communication module of an associated data center platform 110.

In some implementations, information gathered by the sensors of data center platform 110 may be used to communicate information to users in close proximity to the structure 160. The data center platform 110 can be configured to communicate with a mobile device that is in close proximity to the data center platform 110. For example, the data center platform 110 may request and then receive location data from mobile device. The data center platform 110 may then push relevant data to the mobile device, such as location-based news or alerts, including, for example, nearby events, safety alerts, or coupons for nearby businesses. For example, a data center platform 110 deployed on a structure 160 close to a shopping center may receive a signal (e.g., a signal indicative of location data) from a mobile device indicating that the mobile device is in close proximity to the structure 160. Upon receiving the signal from the mobile device, the data center platform 110 may send coupons, operating hours, or special event information related to the shopping center to the mobile device. In an additional example, a data center platform 110 deployed on a structure 160 in a parking lot may receive location data from a mobile device indicating that the mobile device is in close proximity to the structure 160. Upon receiving this location data from the mobile device, the data center platform 110 may send parking information, such as hourly rates or parking reminders, such as the specific section parked in to the mobile device.

In some implementations, the data center platform 110 can be configured to communicate with a motor vehicle. In some implementations, the sensor platform can be configured to communicate with a mobile device connected to a motor vehicle. The data pushed to the motor vehicle may include traffic information, roadwork information, safety information, news, coupons, or advertisements. This data could be pushed to a display or speakers in the motor vehicle.

Figure 10:
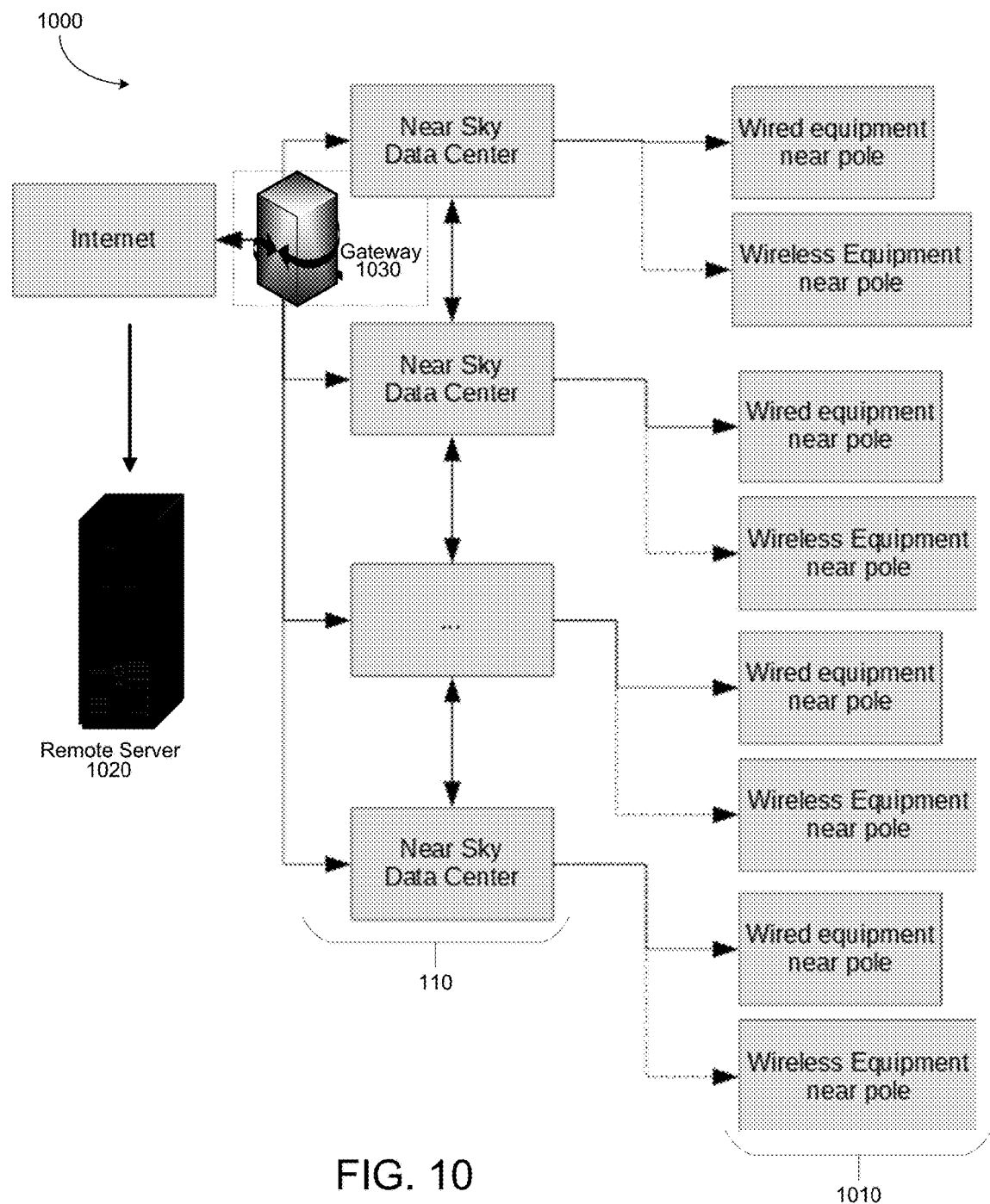
FIG. 10 shows an example of a near sky environment network.

Referring to FIG. 10, the data center platform 110 can be configured to communicate with other data center platforms, as well as gateways (e.g., gateway 1030), or external sensors located on, or in the vicinity of the structure 160. For example, a data center platform 110 may communicate with other data center platforms or external sensors through a wired or wireless connection. The data center platform 110 can include a transceiver to wirelessly communicate with other data center platforms 110, external sensors, or gateways 1030. The transceiver can use a radio frequency (RF) portion of the spectrum for the communications. The data center platforms 110 within the network 106 can be connected to one another by a wired or wireless network. For example, the data center platforms 110 can be connected to one another by a mesh network. A data center platform 110 can act as a node of the mesh network, and/or serve as a relay for other nodes to propagate data using the mesh network. The mesh network can be self-forming and/or self-healing. Information from the sensors included in the data center platform 110 and information from external sensors may be transmitted to a provided communications network 1010. The communications network 1010 may then communicate this sensor data to a remote central management system (e.g., remote server 1020). This central management system may further process the sensor data. In some implementations, the central management system may make decisions regarding changing an operating mode of one or more devices associated with a structures 160 (e.g., a streetlight) in network 1000, informing an authority of the existence of a particular event or condition at or in the vicinity of a structure 160. This event or condition may be, for example, an environmental or threat condition, a gunshot, a traffic event, a movement, or a weather condition.

In some implementations, the data center platforms 110 is configurable, allowing different combinations of individual sensors to be included in the brackets 920 of the data center platform 110. Returning to FIG. 2, in some implementations, a sensor module (not shown) may include a plurality of slots to which individual sensors 280, 285 may be connected. The slots can be connected to other modules of the data center platform 110 such that sensors received within a slot can readily use the other modules. For example, each slot can be connected to the switched mode power supply (SMPS) through electrical connection, making power available to a sensor 280, 285 connected to the slot. In another example, each slot can be connected to a processor through a connection between an input/output port of the slot and the input/output lines. The connections between input/output ports of the slots and the input/output lines may be used, for example, to communicate data between the two or more sensors 280, 285 and/or between the sensors and the IT workload equipment 270. In some implementations, the input/output lines may also provide a connection between the slots and a radio module of the sensor platform. The one or more processors of data center platform 110 may send data to, and/or receive data from one or more of the radio module and the sensor module through the input/output lines.

In some implementations, the slots allow the data center platforms 110 to be configured with a customized set of sensors. For example, data center platforms 110 can be made available to developers, allowing them to configure the sensor module to include appropriate combinations of sensors as needed. As described above, the sensors that can be included on the sensor module include, for example, various combinations of one or more environmental sensors, carbon monoxide sensors, carbon dioxide sensors, noise sensors, seismic sensors, threat sensors, radioactivity sensors, biochemical sensors, contact sensors, motion sensors, parking sensors, traffic counters, or pedestrian counters. In some implementations, data center platforms 110 can be made configurable by including a circuit board having multiple slots for receiving individual sensors. The individual sensors may be connected, for example, to input/output lines by input/output ports. Input/output lines may be used for sending and receiving information between the processor and the sensors 280, 285.

Returning to FIG. 10, an example of a network 1000 can include multiple data center platforms 110. The data center platform 110 can be configured to communicate with other data center platforms deployed on structures (e.g., similar to structure 160) in the near sky environment 100. Network 1000 can include a network of data center platforms. In some implementations, the sensors 280, 285 on data center platform 110 can communicate via transceivers with other sensors of other data center platforms.

In some implementations, the network 1000 can be configured to communicate with a remote server 1020, for example, over a communication network 1010. In some implementations, the communication network 1010 can communicate with a server 1020 via one or more gateways 1030 or access points. In some implementations, the communication network 1010 can communicate with the server 1020 directly. In some implementations, the server 1020 can include an industrial control system. In some implementations, the server 1020 can be a supervisory control and data acquisition (SCADA) server 1020. In some implementations, the server 1020 can be a central management server 1020. In some implementations, the server 1020 can be a server 1020 farm that includes multiple servers 1020.

The network 1000 can include one or more gateways 1030. The gateways 1030 can be data coordinator units that act as a link between data center platforms 110 and the server 1020. In some implementations, one or more of the data center platforms 110 can include a gateway. In some implementations, one of the data center platform 110 includes a gateway 1030 for accessing the rest of the network 1000 from an external computing device. A gateway 1030 can be configured to communicate with data center platforms. For example, a gateway 1030 can be configured to support up to 1000 data center platforms. In some implementations, the gateway 1030 can communicate with other gateways 1030 through a wired or wireless connection. In some implementations, the gateways 1030 can communicate with the server 1020 through a wired connection (e.g., Ethernet). In some implementations, the gateways 1030 can wirelessly communicate with the server 1020. In some implementations, gateways 1030 can use Global System for Mobile Communications (GSM) or General Packet Radio Service (GPRS) to wirelessly communicate with the server 1020. A firewall can separate the gateways 1030 and the server 1020 to keep the server 1020 secure. In some implementations, the network 1000 does not include a gateway 1030.

The gateway 1030 can be a computing device mounted on an existing structure such as a structure 160. The gateway 1030 can include, for example, one or more of a processor, a real-time clock, a transceiver, a memory, an Ethernet port, a USB port, and a serial port. The gateway 1030 can connect to a computing device such as the server 1020 using one of its ports. The gateway 1030 can have an enclosure for wall mounting or an enclosure for pole mounting. The enclosure can be made from polycarbonate.

In some implementations, the communication network 1010 and the server 1020 can be separated by a security layer such as a firewall. In some implementations, the communication network 1010 can include a computing device (e.g. a media convergence server 1020 (MCS)) that receives information from various gateways 1030 and/or data center platforms 110 and communicates with the server 1020, for example, using an Ethernet connection. Such a computing device can also be configured to relay information received from the server 1020 to the gateways 1030. In some implementations, the gateways 1030 can be configured to communicate directly with the server 1020.

In some implementations, the server 1020 can be configured to communicate with various computing devices related to managing the data center platforms 110. One or more of these devices can be configured to execute an application that facilitates individual or grouped management of the data center platforms 110. For example, the server 1020 can be configured to communicate with field staff using, for example, mobile devices and office staff through computing devices. In some implementations, the server 1020 can communicate with one or more computing devices that execute a streetlight management software. In some implementations, the server 1020 executes the streetlight management software and provides user-interfaces on one or more of the mobile device and the computing device.

Other embodiments are within the scope and spirit of the description claims. Additionally, due to the nature of software, functions described above can be implemented using software, hardware, firmware, hardwiring, or combinations of any of these. Features implementing functions may also be physically located at various positions, including being distributed such that portions of functions are implemented at different physical locations. The use of the term "a" herein and throughout the application is not used in a limiting manner and therefore is not meant to exclude a multiple meaning or a "one or more" meaning for the term "a." Additionally, to the extent priority is claimed to a provisional patent application, it should be understood that the provisional patent application is not limiting but includes examples of how the techniques described herein may be implemented.

It will thus be seen that the objects set forth above, among those made apparent from the preceding description, are efficiently attained and, because certain changes may be made in carrying out the above method and in the construction(s) set forth without departing from the spirit and scope of the disclosure, it is intended that all matter contained in the above description and shown in the accompanying drawings shall be interpreted as illustrative and not in a limiting sense.

A number of exemplary implementations of the near sky data platform have been described. Nevertheless, it will be understood by one of ordinary skill in the art that various modifications may be made without departing from the spirit and scope of the described embodiments.

What is claimed is:

1. A configurable data center platform comprising:
   an enclosure configured to affix to an external portion of a support structure, the enclosure configured for housing:
   one or more processing systems that form a data center;
   one or more transceivers configured to enable the one or more processing systems to communicate with one or more remote devices external to the enclosure;
   one or more sensors; and
   an electrical power distribution subsystem configured to condition a received electrical current to one or more conditioned electrical currents that power the one or more processing systems and the one or more sensors;
   wherein the enclosure comprises a cooling system that removes heat from the one or more processing systems and the one or more sensors; and
   wherein the data center is configured to host one or more applications associated with the one or more remote devices, and execute the one or applications for the one or more remote devices.

2. The configurable data center platform of claim 1, wherein the one or more processing systems and the one or more remote devices are configured for distributed processing.

3. The configurable data center platform of claim 1, wherein the one or more processors are configured to communicate with one or more external sensors disposed outside the enclosure.

4. The configurable data center platform of claim 1, wherein the electrical power distribution subsystem comprises one or more of alternating current (AC) to direct current (DC) converters or DC to DC converters.

5. The configurable data center platform of claim 1, wherein the enclosure forms a toroid or near-toroid shape.

6. The configurable data center platform of claim 1, wherein the enclosure comprises a plurality of modular sectors.

7. The configurable data center platform of claim 1, wherein the cooling system comprises a cooling tower configured to cause a convection cooling process inside the enclosure.

8. The configurable data center platform of claim 1, wherein the one or more transceivers enable backhaul communication to the one or more remote devices.

9. The configurable data center platform of claim 8, wherein the backhaul communication comprises high-bandwidth communication to a cloud computing system.

10. The configurable data center platform of claim 8, wherein the backhaul communication comprises low-bandwidth.

11. The configurable data center platform of claim 1, wherein the one or more processing devices comprise an internal management system that provides reconfigurable processing hardware for hosting applications associated with the one or more sensors.

12. The configurable data center platform of claim 1, further comprising a power meter that measures power distributed to each of the one or more sensors and each of the one or more processing devices.

13. The configurable data center platform of claim 1, wherein the received electrical current is received from a low voltage power distribution grid.

14. The configurable data center platform of claim 1, wherein the enclosure comprises a weather shed.

15. The configurable data center platform of claim 1, wherein at least one of the one or more processing systems is remotely configurable by the one or more remote devices in response to receiving access credentials associated with the one or more remote devices.

16. The configurable data center platform of claim 1, wherein one or more processing devices, the one or more sensors, and the one or more transceivers are configured to operate in an environment between −40° C. and 70° C.

17. The configurable data center platform of claim 1, wherein the support structure comprises one of a utility pole, a building façade, or a street light.

18. The configurable data center platform of claim 1, wherein the electrical power distribution subsystem conforms to one or both of IEC 61850-3 and IEEE 1613 standards.

19. The configurable data center platform of claim 1, wherein the one or more processing devices comprise an internal management system that provides reconfigurable processing hardware for hosting the one or more applications associated with the one or more remote devices.

20. The configurable data center platform of claim 1, wherein the one or more processing devices coordinate with one or more additional processing devices of another configurable data center platform.

21. The configurable data center platform of claim 20, wherein the one or more processing devices are configured to locally process data received from the one or more sensors to generate processed data and to transmit the locally processed data to the one or more additional processing devices.

22. The configurable data center platform of claim 1, wherein the one or more sensors comprise one or more of acoustic sensors, vibration sensors, automotive sensors, chemical sensors, electrical sensors, magnetic sensors, wireless sensors, flow sensors, fluid velocity sensors, sensors configured to measure position/speed/acceleration of passing vehicles, optical/imaging sensors, pressure sensors, force sensors, level sensors, thermal sensors, proximity/presence sensors such as motion detectors, environmental sensors, wind-speed sensors, hygrometers, and radio frequency identification (RFID) detectors.

23. The configurable data center platform of claim 1, wherein at least one of the one or more processing systems is remotely programmable by the one or more remote devices to run an application downloaded from the one or more remote devices.

24. The configurable data center platform of claim 1, wherein at least one of the one or more processing systems is configured to be remotely programmable by the one or more remote devices using an application downloaded from the one or more processing systems.

25. The configurable data center platform of claim 1, wherein the cooling system comprises at least a portion of the enclosure.

26. The configurable data center platform of claim 1, wherein the cooling system comprises one or more sun shades configured to obstruct the enclosure from sunlight.

27. The configurable data center platform of claim 26, wherein at least one of the one or more sun shades is temperature-sensitive, wherein the at least one of the one or more sun shades is configured to pass an amount of light that is inversely proportional to a temperature of the at least one of the one or more sun shades.

28. The configurable data center platform of claim 1, wherein the cooling system comprises one or more sun shades, and wherein an air gap exists between a sun shade and enclosure that is configured to cause cooling air convection in the air gap.

* * * * *

UNITED STATES PATENT AND TRADEMARK OFFICE
CERTIFICATE OF CORRECTION

PATENT NO. : 10,238,001 B2
APPLICATION NO. : 15/863747
DATED : March 19, 2019
INVENTOR(S) : Anil Agrawal and William Anthony White, III Page 1 of 1

It is certified that error appears in the above-identified patent and that said Letters Patent is hereby corrected as shown below:

In the Claims

Column 20, Line 31, Claim 1, delete "one or applications" and insert -- one or more applications --

Signed and Sealed this
Twenty-first Day of May, 2019

Andrei Iancu
*Director of the United States Patent and Trademark Office*